United States Patent [19]

Littwin

[11] 4,270,087
[45] May 26, 1981

[54] APPARATUS FOR TESTING PERMANENT MAGNETS USING ELECTRO-MAGNETS AND HALL SENSORS

[76] Inventor: Arthur K. Littwin, 65555 N. LeMai, Lincolnwood, Ill. 60646

[21] Appl. No.: 938,970

[22] Filed: Sep. 1, 1978

[51] Int. Cl.³ .................... G01R 33/12; G01N 27/74
[52] U.S. Cl. .............................. 324/205; 322/DIG. 5; 322/99; 338/32 H; 73/DIG. 3; 324/228; 324/243; 324/261
[58] Field of Search ............... 73/DIG. 3; 324/205, 324/228, 234, 235, 251, 252, 260, 261, 158 MG; 338/32 H; 323/94 H; 361/143, 147, 148; 322/99, DIG. 5

[56] References Cited
U.S. PATENT DOCUMENTS

| | | | |
|---|---|---|---|
| 3,235,776 | 2/1966 | Ireband | 324/205 |
| 3,260,932 | 7/1966 | Weiss et al. | 324/252 |
| 3,418,452 | 12/1968 | Renner | 361/148 |

Primary Examiner—Gerard R. Strecker
Assistant Examiner—Walter E. Snow
Attorney, Agent, or Firm—Paul H. Gallagher

[57] ABSTRACT

Apparatus for testing permanent magnets such as in a generator or alternator embodied in a fly wheel. The apparatus includes a testing head on which the fly wheel is placed for the purpose. The fly wheel has a circular series of permanent magnets, and the head has a corresponding circular series of electro magnets, with Hall Generators between the electro-magnets, the Hall Generators having an element (bismuth) the resistence of which is affected by a magnetic field. The apparatus includes an electrical circuit embodying the Hall Generators, and the electro-magnets are charged, and the voltage set up through the Hall Generators indicates the voltage condition of the permanent magnets and is the voltage which is tested by the apparatus. The apparatus can also be used for motors as well as generators and alternators.

9 Claims, 11 Drawing Figures

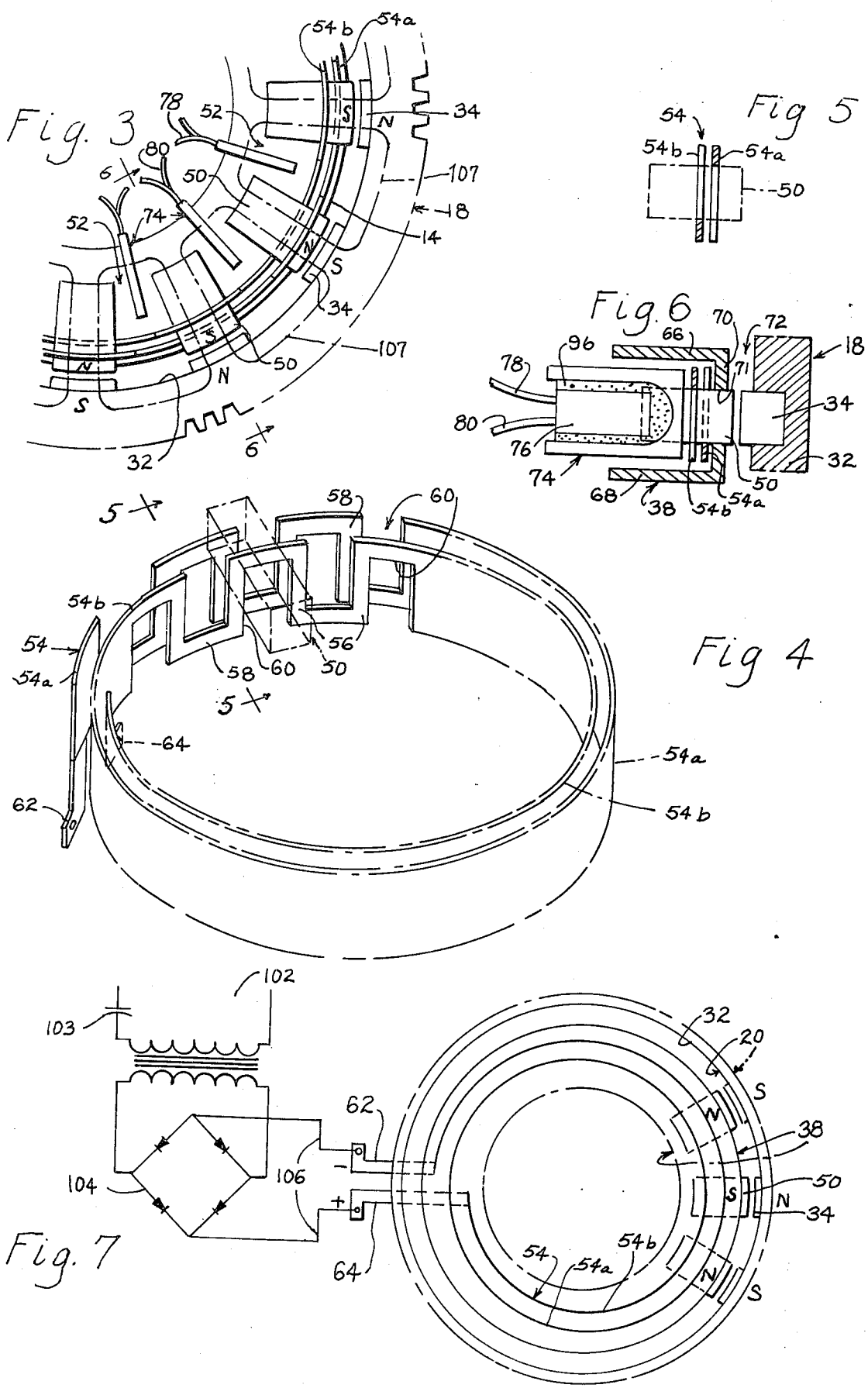

APPARATUS FOR TESTING PERMANENT MAGNETS USING ELECTRO-MAGNETS AND HALL SENSORS

OBJECTS OF THE INVENTION

A broad object of the invention is to provide apparatus and method for testing a permanent magnet arrangement in a device such as a generator or alternator.

Another object is to provide apparatus of the foregoing character incorporating a novel arrangement utilizing Hall Generators in which the resistance is affected by a magnetic field in which it is disposed, for testing the condition of permanent magnets.

A further object is to provide an arrangement of the foregoing character which utilizes a novel arrangement of producing a very small current and having a novel and effective arrangement for amplifying that current, the amplified current being thereupon utilized in measuring the voltage and current established.

A still further object is to provide apparatus of the foregoing character incorporating a novel arrangement utilizing a differential voltage oriented counter to the voltage to be tested, whereby to enable more accurate testing of that voltage being tested.

DESCRIPTION OF A PREFERRED EMBODIMENT

In the drawings

FIG. 3 is a sectional view, showing only principal elements and oriented according to line 3—3 of FIG. 1, and including the corresponding portion of FIG. 2 when fitted down into position on the head;

FIG. 4 is a partial perspective view of a strip serving as a coil for charging the electro-magnets utilized in the head of FIG. 1;

FIG. 5 is a detail view taken at line 5—5 of FIG. 4;

FIG. 6 is a sectional view taken at line 6—6 of FIG. 3;

FIG. 7 is a diagrammatic view oriented according to a plan view of FIG. 1 including the arrangement of the electro-magnets therein and the strip or coil of FIG. 4;

Figure 2:
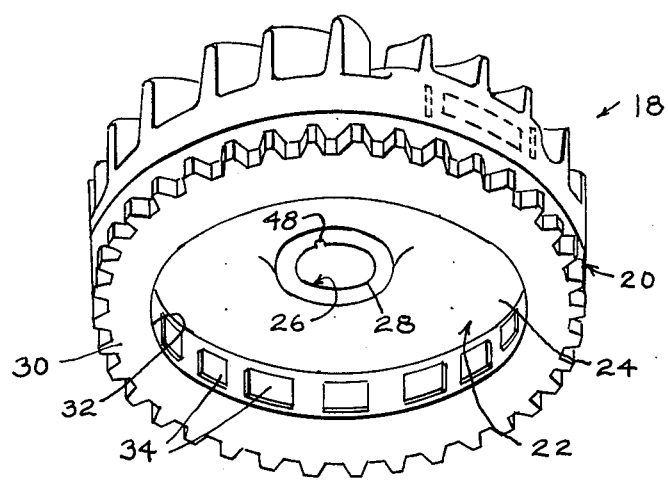
FIG. 2 is a perspective view of a fly wheel which constitutes a component incorporating a plurality of permanent magnets which are to be tested.
Figure 1:
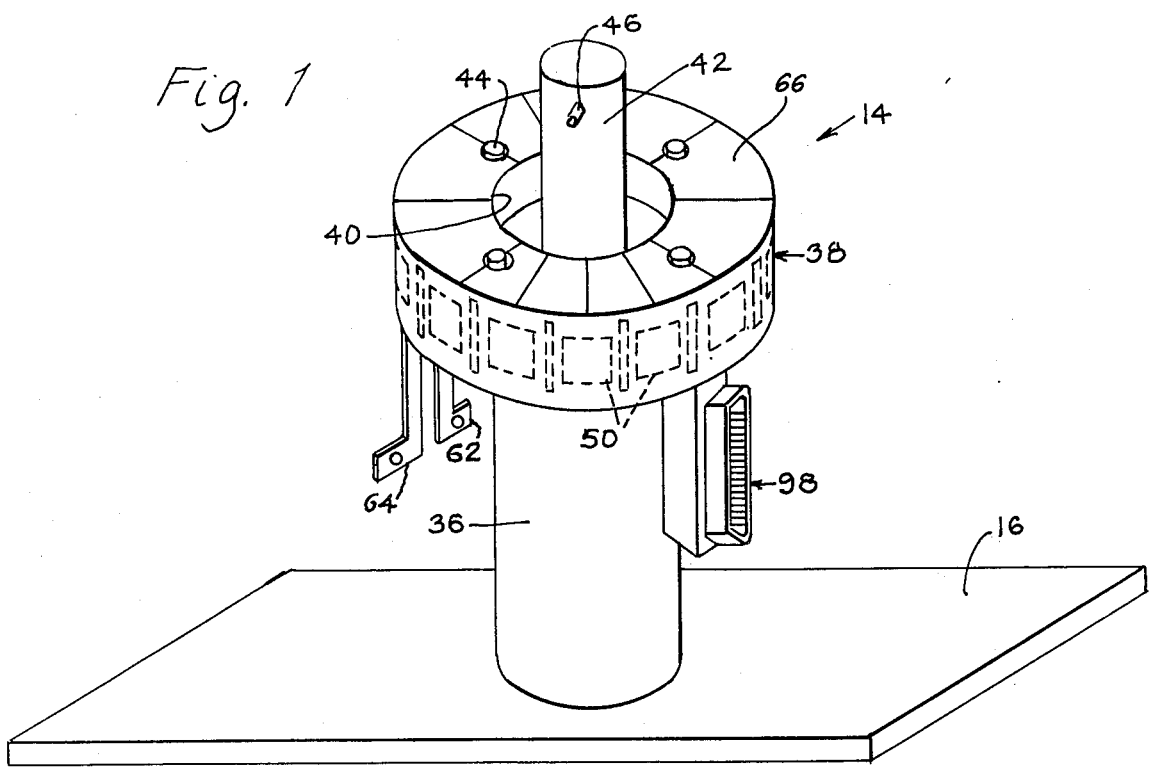
FIG. 1 is a perspective view of a testing head embodying the features of the present invention.

Referring in detail to the accompanying drawings, FIG. 1 shows as a main component of the invention, a testing head 14 mounted on a suitable base 16 and exposed for fitting thereon of a fly wheel 18 (FIG. 2). The fly wheel 18 in the present instance is a component of a Briggs and Stratton engine and is a typical example of various items which the apparatus of the present invention is useful for testing. The fly wheel 18 itself, not constituting a part of the invention, includes a main body 20 having a circular recess 22 on its underside, opening downwardly and defined at the top by an annular top or wall element 24 having a central aperture 26 surrounded by an annular boss or wall 28. The recess 22 is surrounded by a skirt 30 defining a cylindrical wall 32 in which are imbedded a plurality of permanent magnets 34. There are 12 such permanent magnets in the present instance but this is only representative, and they may be of any number within practical limits. The permanent magnets 34 are exposed through the cylindrical wall 32 and these magnets function in the normal operation of the engine in which the fly wheel is embodied, serving as a generator or alternator component. Such an arrangement is of known character and the apparatus of the present invention is devised for testing those magnets.

The testing head of FIG. 1 includes a supporting column 36 upstanding from the base 16, and a body or head proper 38 thereon. The detail construction of this body 38 will be referred to again hereinbelow, but it is of cylindrical shape and has a central aperture 40 and a reduced diameter post 42 extending from the column 36 through the aperture 40 and exposed above the body 38. The fly wheel 18 is fitted over the head 14, the post 42 passing through the aperture 26 and the boss or wall 28 extending into the aperture 40. The surrounding wall 32 of the fly wheel is disposed diametrically in register with the body 38 (FIGS. 3 and 6). The head 14 is provided with suitable stops 44 engaged by the fly wheel, and supporting the latter. The post 42 has a positioning pin 46 which fits into a keyway 48 in the annular wall 28 of the fly wheel, for positioning the fly wheel on the head. Incorporated in the body 38 are a plurality of electro-magnet poles 50, radially arranged and of the same number as the permanent magnets 34, in this case twelve. When the fly wheel is positioned on the body 38 as above mentioned with the positioning pin 46 in the keyway 48, the permanent magnets 34 in the fly wheel are individually aligned radially with respective poles 50, as shown in FIG. 3 each aligned permanent magnet and electro-magnet being also referred to as a set.

The body 38 may be of suitable material such as steel, and the electro-magnet poles 50 have spaces 52 between adjacent poles. The electro-magnet poles 50 are charged by a strip 54 of high conductivity, preferably of copper, which may also be termed a "coil", serving the usual purpose of a coil in an electro-magnet for energizing the pole. The strip or coil 54 is of successively reversed "U" shapes, forming rectangular shaped elements as viewed radially, as in FIG. 4. Each "U" element includes axially extending arms 56 and a web element 58 and the U's forming rectangular notches 60. These notches 60 open axially in opposite directions successively around the coil. The coil is of substantially two complete turns having connecting elements 62, 64 at their ends for connecting in the electrical circuit as referred to again hereinbelow. The two complete turns of the coil, identified 54a and 54b, are relatively positioned in radial direction and with the U's or notches 60 in the two turns arranged axially oppositely, as viewed radially, as referred to again hereinbelow.

The strip or coil 54 is incorporated in the body 38 of the head in direct association with the electro-magnet poles 50 in the manner represented best in FIGS. 3, 4 and 6 wherein the U's or notches 60 receive the poles therein, and the reverse arrangement of the U's or notches in the two turns 54a and 54b providing complete encirclement of each pole, that is, the legs 56 of each and every "U" fit against the poles, but the web elements 58 in each case fit only on an upper or under surface of the pole, but each pole is completely surrounded by the elements of the two turns taken together. This is best represented by the dot-dash line in FIG. 4 representing a pole 50.

The mechanical construction of the body 38 may take any suitable form and as shown in FIG. 6 has an upper wall 66 which is that exposed in FIG. 1, and a lower wall 68. The radially outer portion 70 of the body is provided with a circumferential recess 71 receiving the outer ends of the poles and serving to support and mount the latter. The strip or coil 54 may be supported directly by the poles. It will be noted particularly in FIG. 6 that the space 72 between the body 38 of the head, and the wall 32 of the fly wheel and the magnets 34 thereof, is small, to provide an effective magnetic field from the poles 50 to and through the magnets 34, as referred to again hereinbelow.

Figure 8:
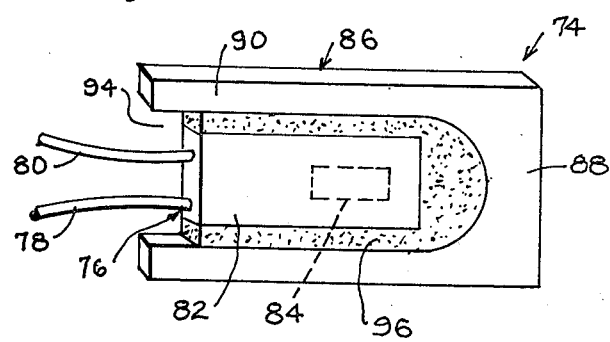
FIG. 8 is a perspective view of a probe unit in which a Hall Generator is incorporated, and a plurality of which are incorporated in the head of FIG. 1.

Associated with the electro-magnet poles 50 are Hail Generator units 74 shown in FIG. 8. Each unit 74 includes what is generally known in the trade as a Hail Generator, 76. Since these devices are generally known a detail description thereof need not be entered into, but each includes an input element 78 and an output element 80. The Hall Generator includes a body 82 and incorporates a bismuth member 84 therein connected with the input and output elements. The electrical arrangement, and its functioning, will be referred to again hereinbelow in connection with the main electrical circuit.

The unit 74 of FIG. 8 includes a novel construction embodying the Hall Generator 76. This unit includes a U-shaped or horseshoe shaped member 86 having a web 88 and legs 90, forming a space 94. The body 82 of the Hall Generator is positioned in the space 94 and positioned in place by a mass of plastic material 96 such as epoxy cement. This epoxy cement 96 and the member 86 are both of insulation material.

The body 82 of the Hall Generator as provided, is relatively slim and the member 86 is made correspondingly slim, and a unit thus formed is positioned in each of the spaces 52 between the electromagnet poles 50 as shown best in FIG. 3. These units 74 are positioned with their ends which contain the web elements 88 disposed directly in the spaces 52 and the opposite ends extending radially inwardly where the input and output elements 78, 80 extend therefrom. The input and output elements 78, 80 are brought into a connector member 98 (FIG. 1) to be fitted with a counterpart connector member 100 of FIG. 9 and incorporated in the main circuit of FIG. 11.

FIG. 7 shows an electrical arrangement for energizing the strip or coil 54 and includes an AC source 102, a capacitor 103, and a rectifier 104 the output leads 106 of which are connected with the end connectors 62, 64. These end connectors 62, 64 are identified specifically as negative and positive corresponding with the arrangement of the electro-magnet poles 50. The permanent magnets 34 are arranged alternately, south, north poles, and the electro-magnet poles 50 are correspondingly arranged, as best shown in FIG. 3. When the strip or coil 54 (FIG. 7) is energized, magnetic field 107 are set up (FIG. 3) through the electro-magnet poles and the permanent magnets. These fields extend through the corresponding poles and magnets and through the body of the fly wheel, and significantly through the Hall Generator units 74. This magnetic field affects the Hall Generators, as is known, the bismuth component in the Hall Generator is affected by a magnetic field, its resistance decreasing, and its conductivity increasing, as the magnetic field increases. This phenomenon is utilized in the present apparatus for testing the condition of the permanent magnets. The Hall Generators are incorporated in the electrical circuit of FIG. 11 as referred to above, and the functioning of the circuit in the testing operation is directly affected by the current passing through the Hall Generators in accordance with the condition of decreased resistance and corresponding increased conductivity, in response to the magnetic fields being set up as just explained.

Figure 11:
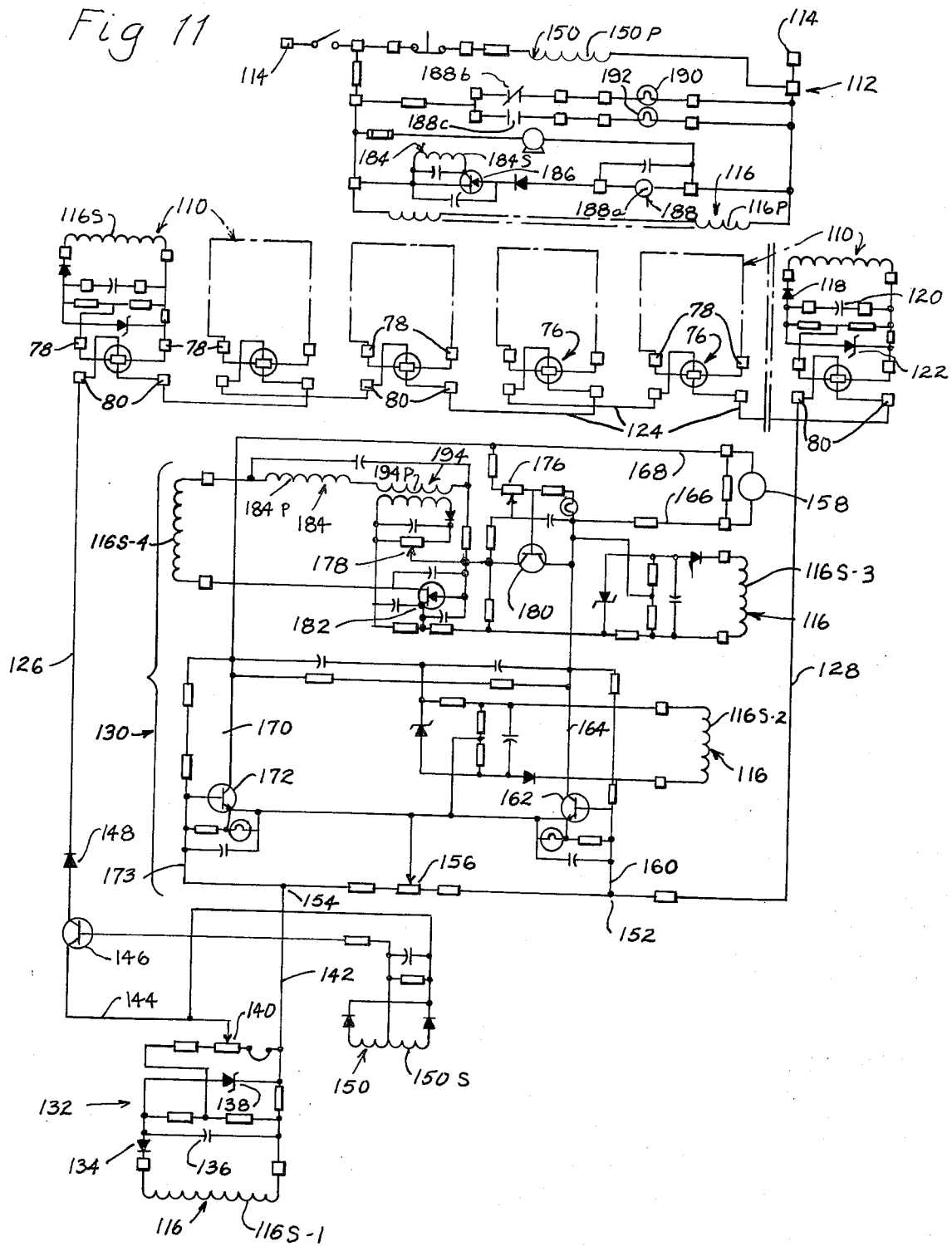
FIG. 11 is a diagram of the main portions of the electrical circuit of the apparatus.

Referring to the main electrical circuit of FIG. 11 the Hall Generators 76 are included in a plurality of sub-circuit units 110, one of the Hall Generators being incorporated in each sub-circuit unit, and thus there being 12 such units. The Hall Generators are represented schematically, each including the input element 78 and the output element 80. These Hall Generators include the bismuth referred to above, by virtue of that bismuth, they are affected by the magnetic field. The detail functioning of these Hall Generators, and the units 110 in which they are incorporated, will be referred to again hereinbelow.

The circuit of FIG. 11 includes an input unit 112 adapted to be connected with a suitable source of AC at 114 and includes various elements and components to be referred to again hereinbelow as well as the primary 116P of a transformer 116, this transformer including secondaries 116S, one in each of the sub-circuit units 110. Other secondaries of this transformer will be referred to hereinbelow, each by the same main reference numeral and the letter "S" and a further postscript 1, 2, 3, 4. Each unit 110 includes a rectifier 118, capacitor 120, and a zener rectifier 122, thus providing a rectified, filtered and zener regulated voltage to the input element 78.

An important feature of the invention is that all of the input elements 78 of the Hall Generators are isolated from each other, and all of the output elements 80 thereof are interconnected in a special series arrangement by the conductors 124. The series interconnection of the output elements is from positive-to-positive, negative-to-negative, in accordance with the polar arrangement of the permanent magnets 34 and their association with the electro-magnet poles 50 as shown best in FIG. 3. The magnetic field of the electro-magnet poles as described above in conjuction with the strip or coil 54 is such that the magnetic field established in the electro-magnet poles is in counter relation to the poles of the permanent magnets 34. The two relative magnetic fields produce a cumulative effect that is impressed on the Hall Generators and the intensity of this resulting magnetic field determines the resistance in the Hall Generators and the current carried therethrough, which is to be tested.

As used herein, rectifiers, transistors, zener diodes, SCR's and mechanical switches, may be referred to generically as valves.

The series connection between the output elements 80 results in cumulative voltage, the terminal ones of these output elements being connected through conductors 126, 128 to an amplifier 130 and to a differential generator 132. The provision of this cumulative voltage, and the incorporation of the differential generator 132 are considered important features of the invention. The differential generator 132 includes a coil 116S-1 forming a secondary to the primary 116P in the input 112. The differential generator 132 includes a rectifier 134, a capacitor 136, and a zener rectifier 138, providing rectified, filtered and zener regulated DC voltage, which is opposed to the cumulative voltage of the output elements 80 and the resulting differential voltage is impressed on the amplifier 130. The differential generator 132 includes a potentiometer 140 (see also FIG. 9), utilized for providing a selected differential voltage to be tested.

The differential generator 132 is in series with the output elements 80, having one conductor 142 leading from the conductor 128 and another conductor 144 leading from the potentiometer 140 through a transistor 146 and through a rectifier 148 to the other conductor 126.

The transistor 146 is controlled by a coil 150S which is a secondary to a primary 150P of an interstage transformer 150 in the input unit 112 (top). Upon energization of the coil 150S the transistor 146 is turned on, completing circuit through the differential generator 132.

Figure 9:
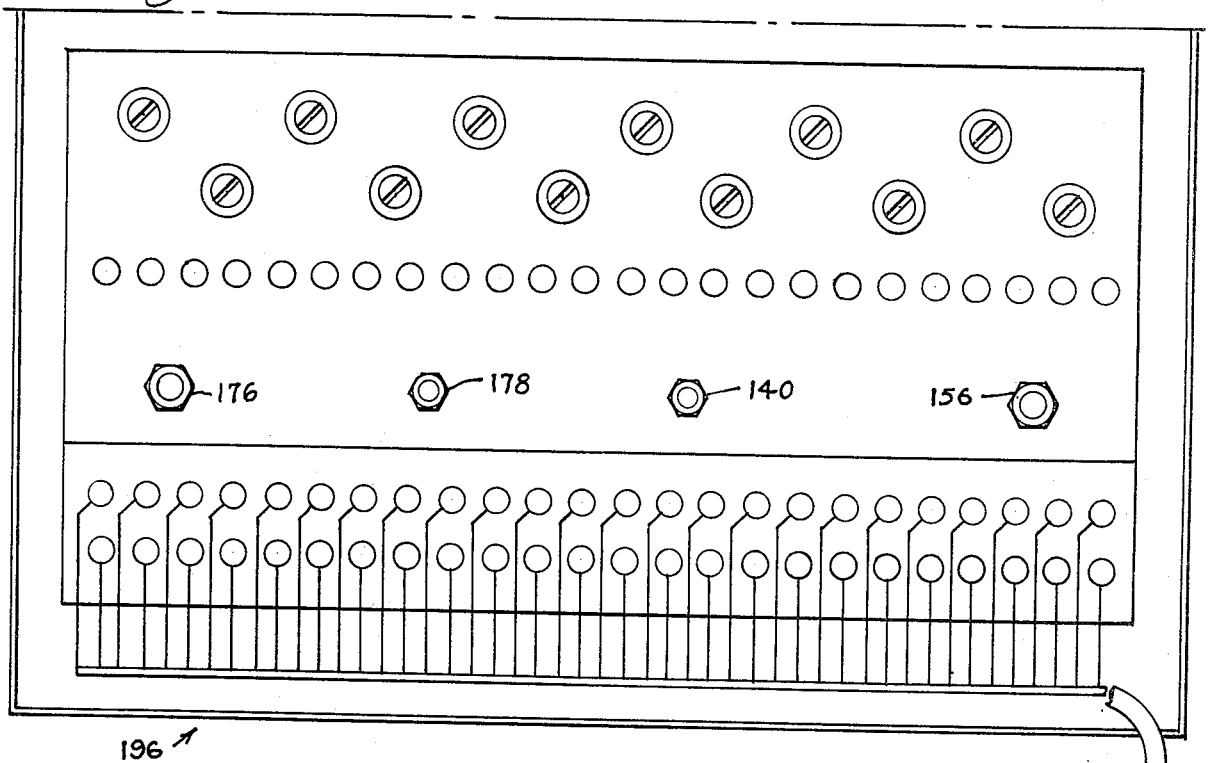
FIG. 9 is a face view of a portion of an instrument panel and chest containing the principal portions of the electrical circuit of the apparatus and certain control elements.
Figure 10:
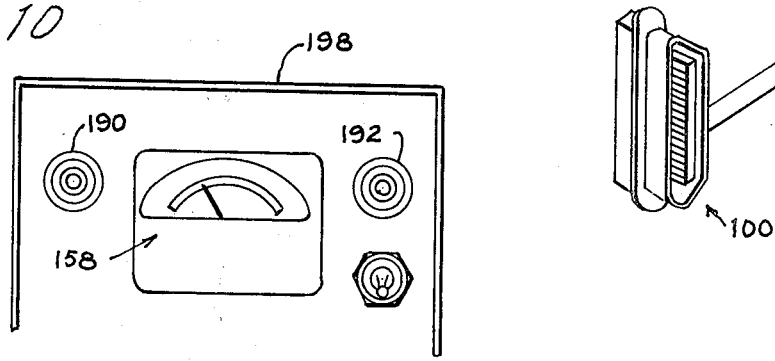
FIG. 10 is a face view of a gauss meter and related elements, utilized in connection with the electrical circuit.

The input to the amplifier 130 is at points 152, 154 and the amplifier includes a zero adjustment potentiometer 156 (see also FIG. 9) and with the amplifier input adjusted to zero, by the potentiometer, the amplifier output is balanced at zero, which is indicated by the ammeter 158 (see also FIG. 10). With the amplifier so balanced at zero, the differential voltage between the cumulative voltage of the outputs 80, at conductor 128, and the differential generator 132, will drive the amplifier, even though it is at a very small value such as one milli-volt or less. The path through the amplifier, from the input point 152 is, conductor 160, transistor 162, conductor 164, conductor 166, the ammeter 158, conductor 168, conductor 170, the transistor 172, conductor 173, to point 154. The transistors 162, 172 are controlled by a secondary 116S-2 of the transformer 116.

A trigger circuit is provided by potentiometers 176, 178 (FIG. 11, center). The output of the amplifier 130 is impressed on a transistor 180, turning the latter on, this furnishing power to the gate of SCR 182 from the secondary 116S-3, the latter then energizing interstage transformer primary 184P in a transformer 184, the secondary 184S of this transformer being in the input unit 112 (top). The secondary 184S energizes the SCR 186 which in turn energizes the relay 188, which has a coil 188a connected with the input at 114, and contacts 188b, 188c. The contacts 188b are normally closed and control a red signal light 190 and the contacts 188c normally open, control a green signal light 192. On de-energization of the secondary 116S-3, the relay 188 is in inactive position, and through the normally closed contacts 188b, the red signal light 190 shows. After the circuit is in operation, and upon energization of the secondary 116S-3, the primary 184P is energized and through the secondary 184S as above referred to, the relay 188 is energized, closing the normally open contacts 188c and energizing the green signal light 192, and at the same time opening the normally closed contacts 188b and extinguishing the red signal light 190.

When the interstage primary 184P is energized, another coil 194P which is in series with that primary, is also energized, this primary being in a transformer 194 having a secondary 194S.

Upon energization of the primary 184P and of the secondary 194S, a trigger differential is produced, determined by an adjustment of the potentiometer 178, this differential controlling the ON and OFF conditions, and prevents oscillations. It is important to prevent such oscillations because of the high sensitivity of the amplifier and it is necessary to retain the relay 188 completely ON or completely OFF, to reliably retain the red and green lights 190, 192 in proper condition, respectively ON or OFF.

In a testing operation, the operator energizes the AC source 102 (FIG. 7) which charges the capacitor 103 which is timed at about 0.05 second. Upon discharge it impresses a DC voltage on the electro-magnets 50 of about three cycles duration of the AC. This sets up a predetermined intensity of the magnetic field (107 of FIG. 3) in the electro-magnets 50 and permanent magnets 34 which is impressed on the Hall Generators. A current is produced in the Hall Generators according to the intensity of the magnetic field as explained above. In a practical example the voltage established in a single Hall Generator may be on the order of 0.045 volts DC. The cumulative voltage in the twelve Hall Generators is then on the order of 0.549 volts DC. The amplifier is operative for amplifying on the order of 400 to 1 and a total voltage is thereby produced in the neighborhood of 21.96 volts.

The differential generator 132 provides utmost accuracy in testing the cumulative voltage. This component produces voltage opposing the cumulative voltage, and the potentiometer 156 makes it possible to produce a zero condition, and accurately indicate it, and consequently the differential of the cumulative voltage over the voltage of the differential generator is that voltage that is indicated and measured. This renders it possible and convenient to eliminate irregular and random variations. This accurately established differential voltage is then amplified, producing a true indication of the voltage. A further accuracy factor is provided by the fact that the cumulative voltage and the differential voltage are produced from the same source, —the transformer 116.

The instrument chest and panel 196 of FIG. 9 may be constructed in any suitable form and includes the greatest portion of the circuitry of FIG. 11 and associated components. The circuitry is connected with the head 14 of FIG. 1, as mentioned above through the connectors 98, 100 and the panel may have exposed as many of the instruments as is desired for adjustment or observation. The ammeter of FIG. 10 is mounted in a suitable panel 198 and this panel similarly may have various ones of the instruments referred to such for example as the red and green signal lights, 190, 192 included in the circuit diagram of FIG. 11 at the top.

I claim:

1. Apparatus for testing a plurality of permanent magnets arranged in a series, comprising,
    an input circuit unit adapted for connection with a source of AC and including the primary of transformer means,
    a series of electro-magnets positioned in close proximity and relation individually to respective ones of the permanent magnets, each related permanent magnet and electro-magnet forming a set,
    means adapted for connection with a source of DC and establishing a magnetic field in each electro-magnet,
    a sensing probe positioned in close proximity to each said set, each sensing probe including an input element and an output element, the magnetic field passing through the related permanent magnet and electro-magnet of each set and through the sensing probe related to that set, a series of sub-circuit units each including a secondary of said transformer means and the input element of one of the sensing probes in series, an output circuit unit including the output elements of the sensing probes interconnected in series without electrical controls therebetween, and thereby establishing an accumulation of the voltages of all of said sets, and means responsive to the output circuit unit for measuring the accumulated voltage.

2. Apparatus according to claim 1 wherein, the sensing probes include a material in which the electrical resistance decreases, and through which electrical current thereby increases in response to increased intensity of said magnetic fields.

3. Apparatus according to claim 2 wherein, said sensing probes include Hall Generators containing bismuth as said material.

4. Apparatus according to claim 2 wherein, the secondary and input element in each sub-circuit unit are isolated from those of all other sub-circuit units, and the output elements are connected in series, this series connection constituting the series connection of said sensing probes.

5. Apparatus according to claim 4 wherein, each sensing probe is positioned between a pair of adjacent sets of permanent magnets and electro-magnets, and each magnet field extends through said adjacent sets and through the related sensing probe therebetween.

6. Apparatus according to claim 5 wherein, the permanent magnets have poles in alignment individually with said electro-magents of the respective sets, successive ones having opposite poles in alignment, the electro-magnets have poles adjacent to and opposite respective ones of the poles of the permanent magnets, and each magnetic field is in the form of a circuit extending through a pair of adjacent sets and thereby through the opposite poles of both of that pair of sets, so that progressing linearly around the magnetic circuit, the passage through the poles in each set is in the same direction with respect to positive and negative polarity.

7. Apparatus according to claim 6 wherein, the means for establishing a magnetic field includes a coil having a pair of turns each with circumferentially successive notches opening in opposite directions axially, and the notches of the two coils being respectively aligned radially, and those of each radially aligned pair being directed oppositely in axial directions, the notches of each radially aligned pair receiving an electro-magnet, and the elements defining the two notches together entirely encircling the electro-magnet.

8. Apparatus according to claim 2 and including, a differential generator for producing a voltage opposed to that of the cumulative voltage of the sensing probes, and thereby producing a differential voltage therefrom, and the means for measuring the accumulated voltage is operative for so measuring by measuring the differential voltage.

9. Apparatus according to claim 8 wherein said transformer means includes a secondary for producing said voltage in said differential generator.

* * * * *